United States Patent
Dusatko

(10) Patent No.: US 9,344,271 B1
(45) Date of Patent: May 17, 2016

(54) DIGITAL CORRECTION OF SPURIOUS TONES CAUSED BY A PHASE DETECTOR OF A HYBRID ANALOG-DIGITAL DELTA-SIGMA MODULATOR BASED FRACTIONAL-N PHASE LOCKED LOOP

(71) Applicant: PMC-SIERRA US, INC., Sunnyvale, CA (US)

(72) Inventor: Tomas A. Dusatko, Vancouver (CA)

(73) Assignee: MICROSEMI STORAGE SOLUTIONS (U.S.), INC., Aliso Viejo, CA (US)

( * ) Notice: Subject to any disclaimer, the term of this patent is extended or adjusted under 35 U.S.C. 154(b) by 0 days.

(21) Appl. No.: 14/668,195

(22) Filed: Mar. 25, 2015

Related U.S. Application Data

(60) Provisional application No. 61/969,965, filed on Mar. 25, 2014.

(51) Int. Cl.
| | |
|---|---|
| *H03L 7/085* | (2006.01) |
| *H03L 7/197* | (2006.01) |
| *H04L 7/033* | (2006.01) |
| *H03M 7/30* | (2006.01) |

(52) U.S. Cl.
CPC .............. *H04L 7/0331* (2013.01); *H03L 7/085* (2013.01); *H03L 7/197* (2013.01); *H03M 7/3015* (2013.01)

(58) Field of Classification Search
CPC ........... H03L 7/08; H03L 7/085; H03L 7/087; H03L 7/16; H03L 7/18; H03L 7/193; H03L 7/197; H03L 7/1976
USPC ........... 375/376; 327/156, 159; 331/1 R, 1 A, 331/18, 25
See application file for complete search history.

(56) References Cited

U.S. PATENT DOCUMENTS

| | | | |
|---|---|---|---|
| 6,236,703 B1 | 5/2001 | Riley | |
| 7,177,611 B2* | 2/2007 | Goldman | ................ H03L 7/093 331/17 |
| 7,522,011 B2* | 4/2009 | Matero | ................ H03C 3/0925 331/16 |
| 8,031,008 B2 | 10/2011 | Wang et al. | |
| 2003/0189503 A1* | 10/2003 | Kim | ........................ H03M 9/00 341/100 |
| 2010/0283549 A1* | 11/2010 | Wang | ...................... H03L 7/087 331/34 |
| 2013/0027102 A1* | 1/2013 | Chen | ........................ H03K 3/03 327/158 |
| 2013/0259103 A1* | 10/2013 | Jensen | ................ H03M 7/3017 375/219 |
| 2014/0070856 A1* | 3/2014 | Ainspan | .................. H03L 7/087 327/145 |
| 2014/0097875 A1* | 4/2014 | Tertinek | ................ H03L 7/1976 327/105 |

\* cited by examiner

*Primary Examiner* — Betsy Deppe
(74) *Attorney, Agent, or Firm* — Dennis R. Haszko

(57) ABSTRACT

A hybrid analog-digital, dual path, delta-sigma modulator (DSM) based fractional-N phase-lock-loop (PLL) that includes an integral path and a proportional path is provided. The integral path is implemented in the digital domain. The proportional path may be implemented in either the digital or analog domain. A feed-forward error correction signal generator is used to generate a feed-forward signal for attenuating in-band spurs generated by the quantization error of the integral path phase detector.

21 Claims, 16 Drawing Sheets

DIGITAL CORRECTION OF SPURIOUS TONES CAUSED BY A PHASE DETECTOR OF A HYBRID ANALOG-DIGITAL DELTA-SIGMA MODULATOR BASED FRACTIONAL-N PHASE LOCKED LOOP

CROSS REFERENCE TO RELATED APPLICATIONS

This application claims the benefit of priority of U.S. Provisional Patent Application No. 61/969,965 filed Mar. 25, 2014, which is incorporated herein by reference in its entirety.

FIELD

The present disclosure relates generally to a delta-sigma modulator (DSM) based fractional-N phase locked loop (PLL). More particularly, the present disclosure relates to a hybrid analog-digital DSM based fractional-N PLL.

BACKGROUND

Non-linearity in the phase-detector (PD) and charge-pump (CP) of a DSM based fractional-N PLL causes spurious tones (hereinafter referred to as "spurs") in the output clock of the DSM based, fractional-N PLL. This is a well-known problem associated with this PLL architecture and is commonly addressed by: (1) ensuring that the PD and the CP are designed to be as linear as possible; and (2) reducing the PLL bandwidth to attenuate spurs. A block diagram of a well-known DSM based fractional-N PLL architecture is shown in FIG. 1.

Another well-known DSM based fractional-N PLL architecture is a dual-path, hybrid analog-digital DSM based fractional-N PLL architecture. The dual-path, hybrid analog-digital DSM based fractional-N PLL architecture breaks the loop-filter into two separate paths that operate in parallel, which allows for separate design of the proportional control path (high-bandwidth path) and integral control path (low-bandwidth path). A problem with known dual-path, hybrid analog-digital DSM based fractional-N PLL architectures is that non-linearity in each path contributes to in-band spurs.

Improvements in dual-path, hybrid analog-digital DSM based fractional-N PLLs are therefore desirable.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides a dual-path, hybrid analog-digital delta-sigma modulator (DSM) based fractional-N phase-lock-loop (PLL) comprising: an integral path implemented in the digital domain, the integral path including an integral path phase detector; a proportional path; and a feed-forward error correction signal generator for generating a feed-forward signal for attenuating in-band spurs generated by quantization of a phase detector error output from the integral path phase detector.

In some embodiments, the proportional path is implemented in the analog domain while in other embodiments the proportional path is implemented in the digital domain.

In an embodiment, the phase detector converts an input analog phase error to a digital value. In various embodiments, the phase detector can comprise a 1-bit phase quantizer, a multi-bit phase detector, or an analog phase detector.

In some embodiments, the proportional path comprises: a proportional path phase detector; and a proportional path loop filter coupled to an output of the proportional path phase detector, the proportional path loop filter configured to provide a proportional path control signal.

The integral path may further comprise: an integral path loop filter coupled to an output of the integral path phase detector, the integral path loop filter configured to provide an integral path control signal. The proportional path control signal and the integral path control signal may be combined to produce a combined control signal. The hybrid analog-digital DSM based fractional-N PLL may further comprises a voltage controlled oscillator (VCO) for receiving the combined control signal.

In some embodiments, the dual-path, hybrid analog-digital DSM based fractional-N PLL, further comprises: a delta sigma modulator (DSM) coupled to the feed-forward error correction signal generator; and a fractional divider in a feedback path of the fractional-N PLL, the fractional divider having an input for receiving a control signal from the delta sigma modulator.

In various embodiments, the feed-forward error correction signal generator generates the feed forward correction signal according to the equation:

$$Q[k] = SGN\left[\sum_{i=1}^{k}\left(F[i] - \frac{n[i-\tau]}{d[i-\tau]}\right)\right]$$

where Q[k] represents the feed forward signal, F[i] represents an output of the delta sigma modulator, n/d is a input to the DSM, and τ represents any possible pipelining delay that may exist. In some embodiments, τ may take on various values, including but not limited to, zero.

In various embodiments, the feed-forward error correction signal generator accounts for gain variations in the phase detector due to at least one of temperature, process, and voltage. In various embodiments, this is accomplished by including gain when generating the correction signal to match the analog gain of the multi-bit quantizer in the integral path.

In some embodiments, the feed-forward error correction signal generator is configured to: generate a representative signal of the instantaneous phase detector error output from the integral path phase detector by accumulating a DSM noise code sequence; truncate the representative signal to replicate non-linearity of the integral path phase detector; and subtract the truncated representative signal from an output of the phase detector.

In another aspect, the present disclosure provides a serializer-deserializer comprising any of the above-described dual-path, hybrid analog-digital DSM based fractional-N PLLs.

In yet another aspect, the present disclosure provides a method of correcting spurious tones in a dual-path, hybrid analog-digital delta-sigma modulator (DSM) based fractional-N phase-lock-loop (PLL), the PLL including an integral path implemented in the digital domain, a proportional path, and a DSM, the integral path including an integral path phase detector, the method comprising: generating a representative signal of the instantaneous phase detector error output from the integral path phase detector by accumulating a DSM noise code sequence; truncating the representative signal to replicate non-linearity of the integral path phase detector; and subtracting the truncated representative signal from an output of the phase detector.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DESCRIPTION

Figure 1:
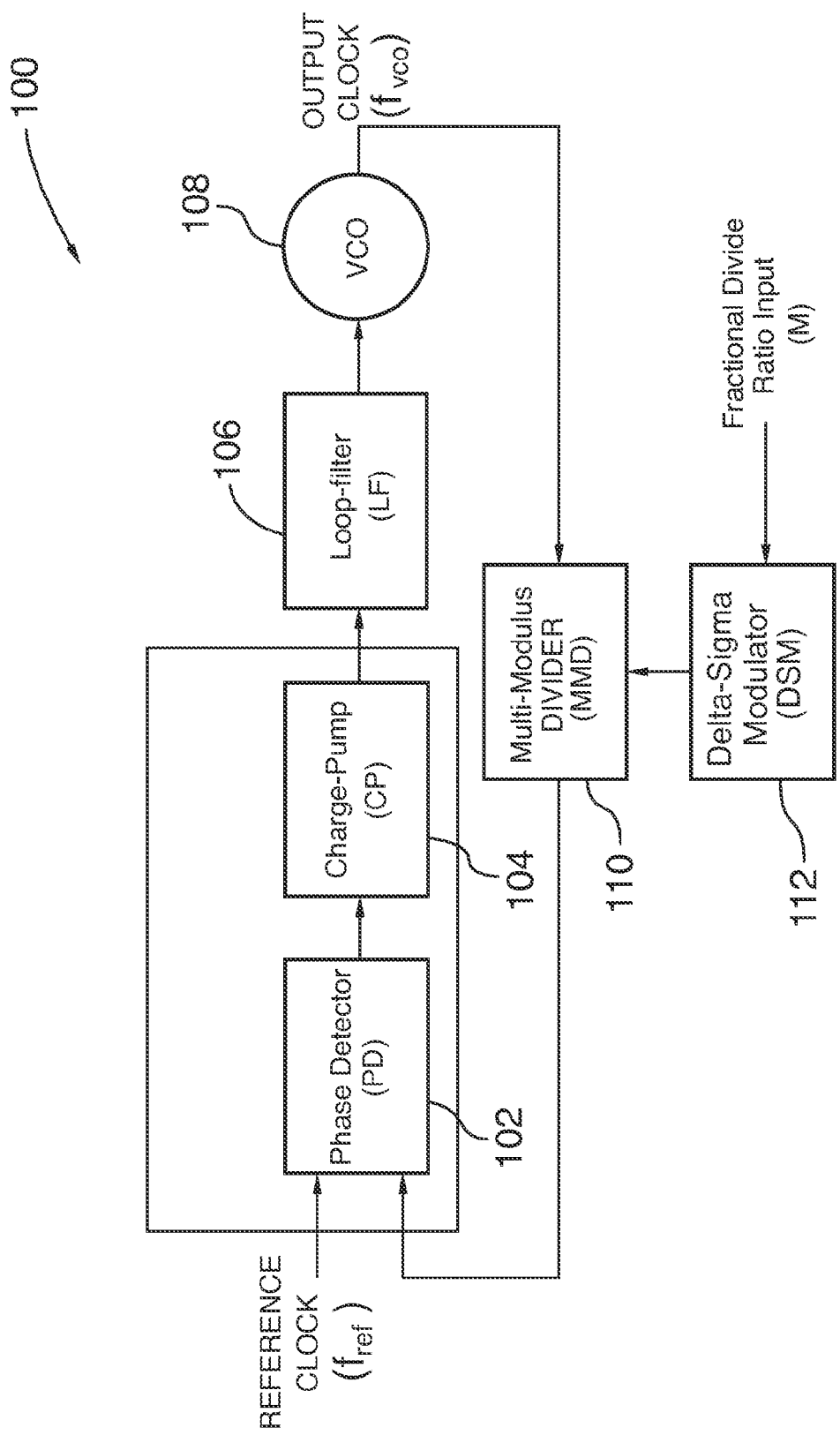
FIG. 1 is a block diagram of a fractional-N PLL.

Embodiments of the present disclosure will now be described, by way of example only, with reference to the attached figures, in which features sharing reference numerals with a common final two digits of a reference numeral correspond to similar or analogous features across multiple figures.

Various embodiments disclosed herein relate to a dual-path, hybrid analog-digital DSM based fractional-N PLL where the integral path is implemented in the digital domain and the proportional path is implemented in the analog domain. In other embodiments, the proportional path is implement in the digital domain. The present disclosure addresses the problem of spurs generated in the integral path by the non-linear quantization of the phase detector (PD). The PD in the integral path quantizes the phase-error and converts it to a digital value that is used by a digital loop-filter.

Some embodiments disclosed herein are applicable to any hybrid analog/digital dual-path, delta-sigma modulator (DSM) based, fractional-N PLL that is used for clock generation. Some embodiments are particularly suited for applications that have requirements on the magnitude of spurious tones and phase jitter at frequencies close to the carrier clock rate. Examples include Optical Transport Network (OTN) standards, and most wireless standards such as GSM and LTE.

Some embodiments disclosed herein relate to methods and apparatus for reducing the magnitude of close-to-carrier tones in hybrid analog/digital dual-path, delta-sigma modulator (DSM) based fractional-N phase-locked loops (PLLs). In fractional-N PLLs, spurious tones are a common problem and are usually generated at fixed frequency offsets from the output clock.

The locations of these tones are related to the fractional multiplication ratio and are particularly problematic when the multiplication ratio is very close to an integer number. In these cases, these spurious tones appear at frequencies lower than the PLL bandwidth and are not attenuated by the loop transfer function.

Various embodiments disclosed herein apply to dual-path PLLs, where integral and proportional control of the feedback loop is split into two independent, parallel paths. In such an architecture, it can be advantageous to use a simple low-resolution phase-detector in the digital integral path; however, this also increases the magnitude of the fractional spurious tones in the output spectrum due to the inherently non-linear, quantization process. Accordingly, some embodiments disclosed herein seek to compensate for the non-linear distortion of coarse integral path quantization, by using a feed-forward digital-correction signal.

A problem encountered when using a fractional-N PLL architecture is the generation of spurious tones in the output clock. Reference is made to FIG. 1, which is a block diagram of a fractional-N PLL 100. FIG. 1 illustrates the main sub-blocks of this type of PLL.

PLL 100 includes a phase-detector 102, a charge-pump 104, a loop-filter 106, a voltage-controlled oscillator 108, multi-modulus divider 110, and a delta-sigma modulator (DSM) 112. The phase-detector (PD) 102 compares the phase of a reference clock (usually from a clean source such as a crystal oscillator) to that of a divided down clock derived from the local voltage-controlled oscillator (VCO). The error between the phases of these two clocks is measured, filtered by the loop-filter 106 and converted to an appropriate control signal for the VCO 108. When the PLL is locked, the average phase error between the reference and feedback clock is zero and the frequency of the VCO clock ($f_{vco}$) is set to:

$$f_{vco}=M*f_{ref} \quad (1)$$

where, M is the average divider ratio of the feedback divider (i.e. multi-modulus divider 110) and $f_{ref}$ is the frequency of the reference clock. PLLs are often referred to as clock-multipliers because they generate a clock with an output frequency that is M times larger than the input. In the case of a fractional-N PLL the average divide ratio of $f_{vco}/f_{ref}$ is not restricted to integer numbers and can be any rational fraction:

$$M = N + \frac{n}{d} \quad (2)$$

where, n and d are integer numbers, and n/d represents the fractional part of the divide ratio. In the case of a delta-sigma based fractional-N PLL, the numerator of this fractional term is modulated using a delta-sigma modulator. In a common practical digital implementation, the n/d in this equation becomes a function of time:

$$M=N+k(t) \quad (3)$$

where k(t) is a pseudo random sequence of integer numbers with expected value (long-term average) equal to n/d. By shaping the frequency spectrum of k(t) with a delta-sigma modulator, the quantization noise of this discrete switching sequence can be shaped to higher frequencies where it is filtered by the PLL low-pass response bandwidth. Note that in the more general case, this sequence need not be generated by a DSM and can be generated by any digital system that generates a sequence of samples with long-term average equal to n/d.

One of the drawbacks of fractional-N modulation is that it is prone to fractional phase-noise spurs that occur at frequency offsets of:

$$f_{tone} = j * \frac{n}{d} * f_{ref}, \quad j \in \{1, 2, 3 \ldots\} \quad (4)$$

These spurs are generally caused by two different reasons: (1) Delta-sigma modulator idle tones; and (2) Non-linearity in the phase-detector.

The first of these is a well-known phenomenon in delta-sigma modulators when they are used with static input signals. These tones can be mitigated by using higher-order modulators and well known techniques such as dithering to help reduce any correlation in the output sequence.

However, even with using these techniques to reduce the presence of tones in the delta-sigma modulator output sequence, fractional-N PLLs are still prone to unwanted fractional tones from non-linearity in the PLL phase error detector. If the conversion gain from phase-error (at the PLL input) to VCO control signal (at the phase detector output) is non-linear, higher order noise and spurious tones will be re-generated in the PLL loop. Furthermore, if these tones are at a low-enough frequency, they will lie inside the PLL bandwidth and not benefit from any filtering.

Figure 2:
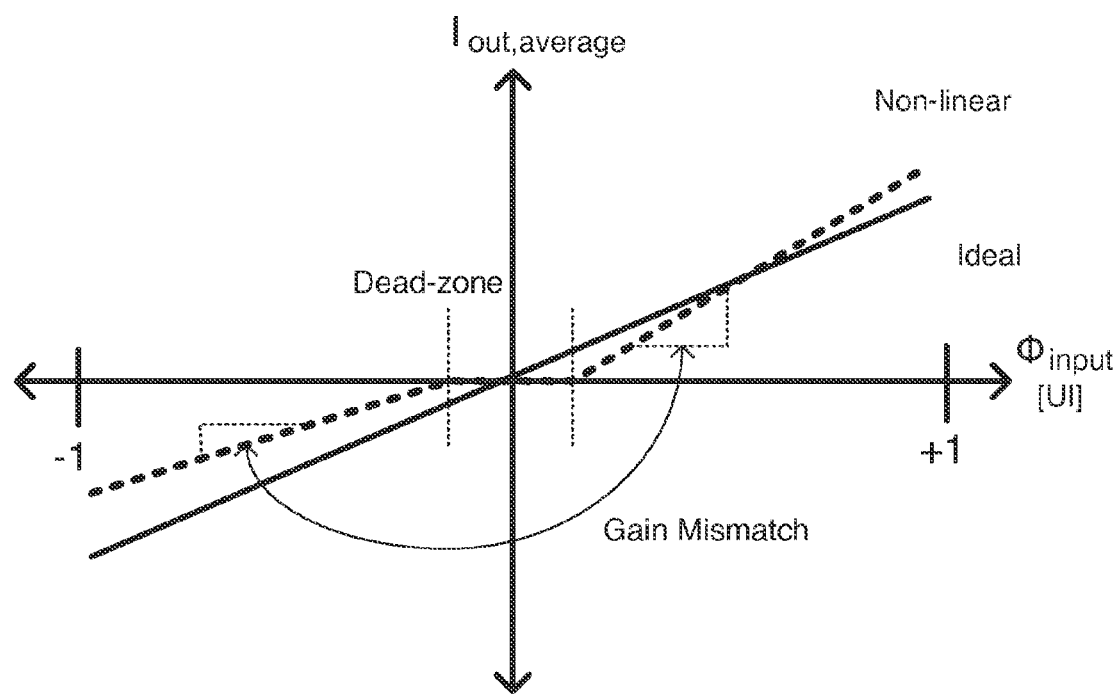
FIG. 2 is a graph illustrating analog phase non-linearity.

This non-linearity in the error detector can result from many different sources and can take different forms such as a dead-zone, hysteresis, or simple gain-mismatch between positive and negative phase errors. An example of these non-linearities in a common analog phase-detector is illustrated in FIG. 2. The ideal characteristic is illustrated by the solid line. The non-linear response is illustrated by the dotted line.

Figure 3A:
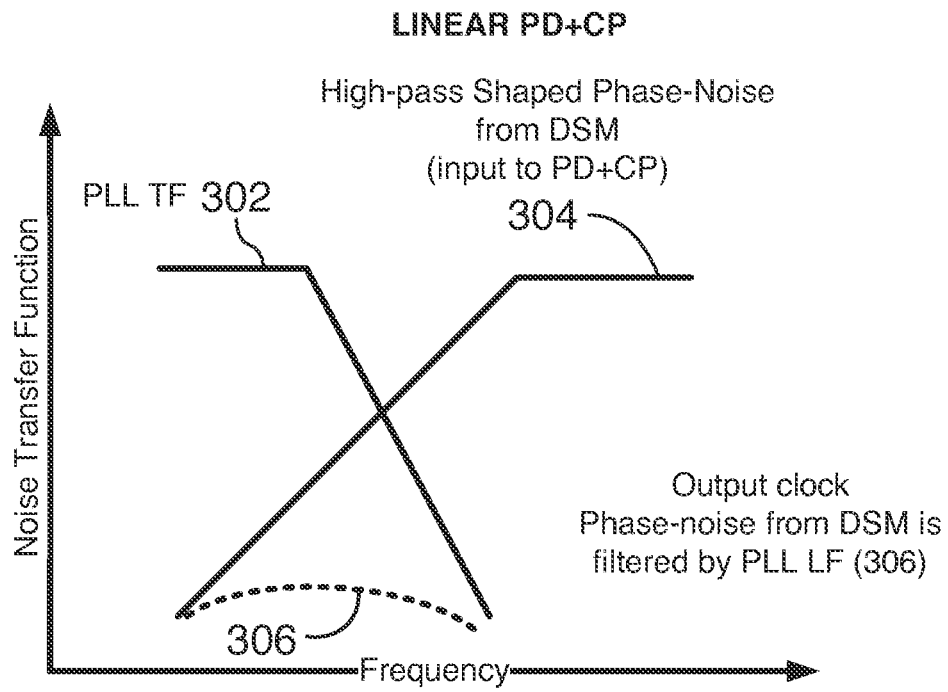
FIGS. 3A and 3B are graphs illustrating noise transfer functions in the PLL of FIG. 1.
Figure 3B:
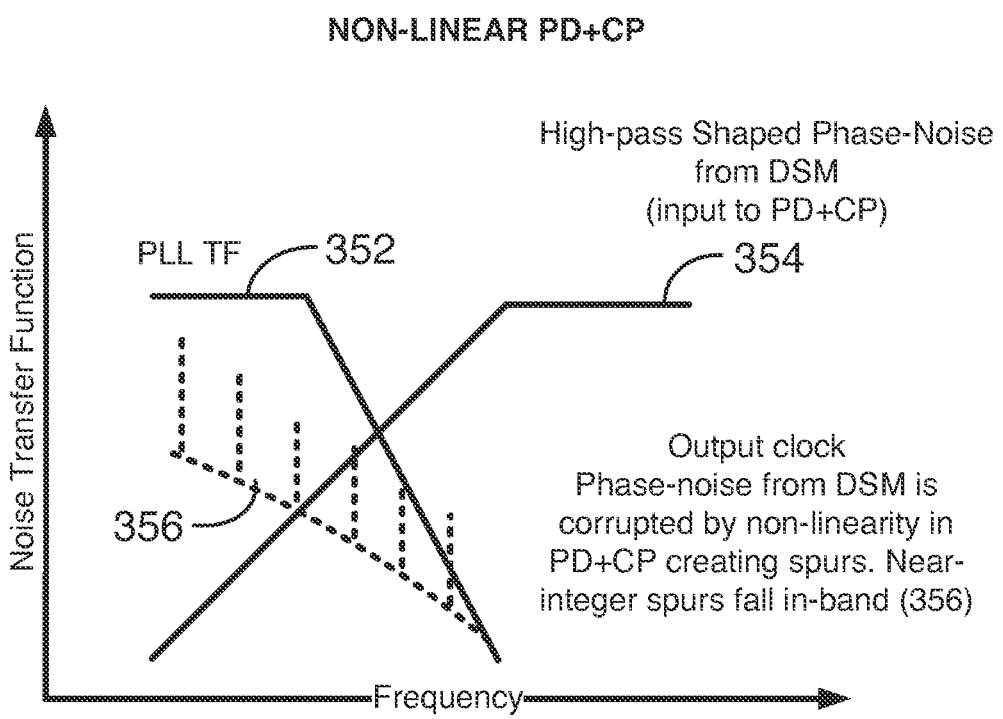

An illustrative comparison of the delta-sigma output noise in these two cases is shown in FIGS. 3A and 3B. In FIGS. 3A and 3B, curves 302 and 352 represent the PLL transfer function, curves 304 and 354 represents the high-pass shaped phase-noise from the DSM, and curves 306 and 356 represent the output clock phase noise. In the ideal case (FIG. 3A) the noise generated by the delta-sigma modulator is filtered by the PLL loop and does not appear at the output of the PLL. In the case of a non-linear phase detector (FIG. 3B), however, the DSM sequence is corrupted and noise and tones fold back into the PLL bandwidth where they subsequently appear at the PLL output. As a result of this effect, a major design challenge when implementing a high-performance fractional-N PLL is to make the phase-detector as linear as possible.

The same problems associated with non-linearity in the error-detector of a traditional analog fractional-N PLL are also associated with dual-path PLLs.

Figure 4:
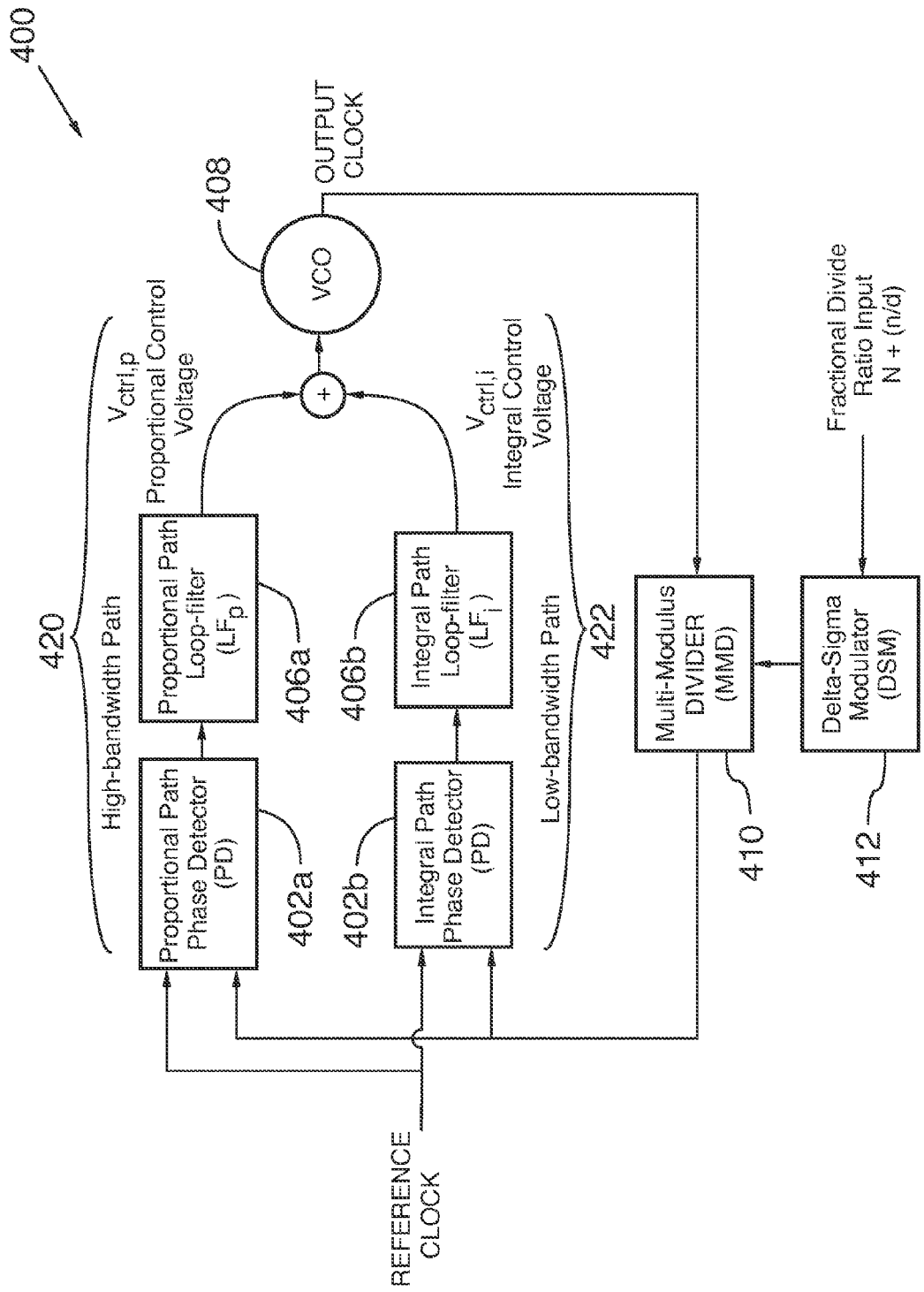
FIG. 4 is a block diagram of a dual path fractional-N PLL, according to an embodiment.

The well-known dual-path PLL architecture, which is illustrated in FIG. 4, breaks the proportional path control, and integral path control into two separate parallel control signals. These control signals are then combined to drive the VCO 408 in the PLL 400 as shown in FIG. 4.

This type of PLL allows for separate design of the path that provides proportional control (high-bandwidth path) 420 and integral control (low-bandwidth path) 422. The proportional control path 420 includes a proportional path phase detector (PD) 402a and a proportional path loop-filter (LFp) 406a. The integral control path 422 includes an integral path phase detector 402b and an integral path loop-filter (LFi) 406b. PLL 400 further includes a multi-modulus divider 410 and a delta-sigma modulator (DSM) 412. Both the proportional and integral control paths can be optimized to achieve noise or settling time goals, and also can be implemented in either the digital or analog domains. The main drawback of this structure is that the non-linearity in each path contributes to spurs in the PLL output. When used in demanding applications with strict in-band noise/spur requirements, both of these paths must be made as linear as possible.

Figure 5:
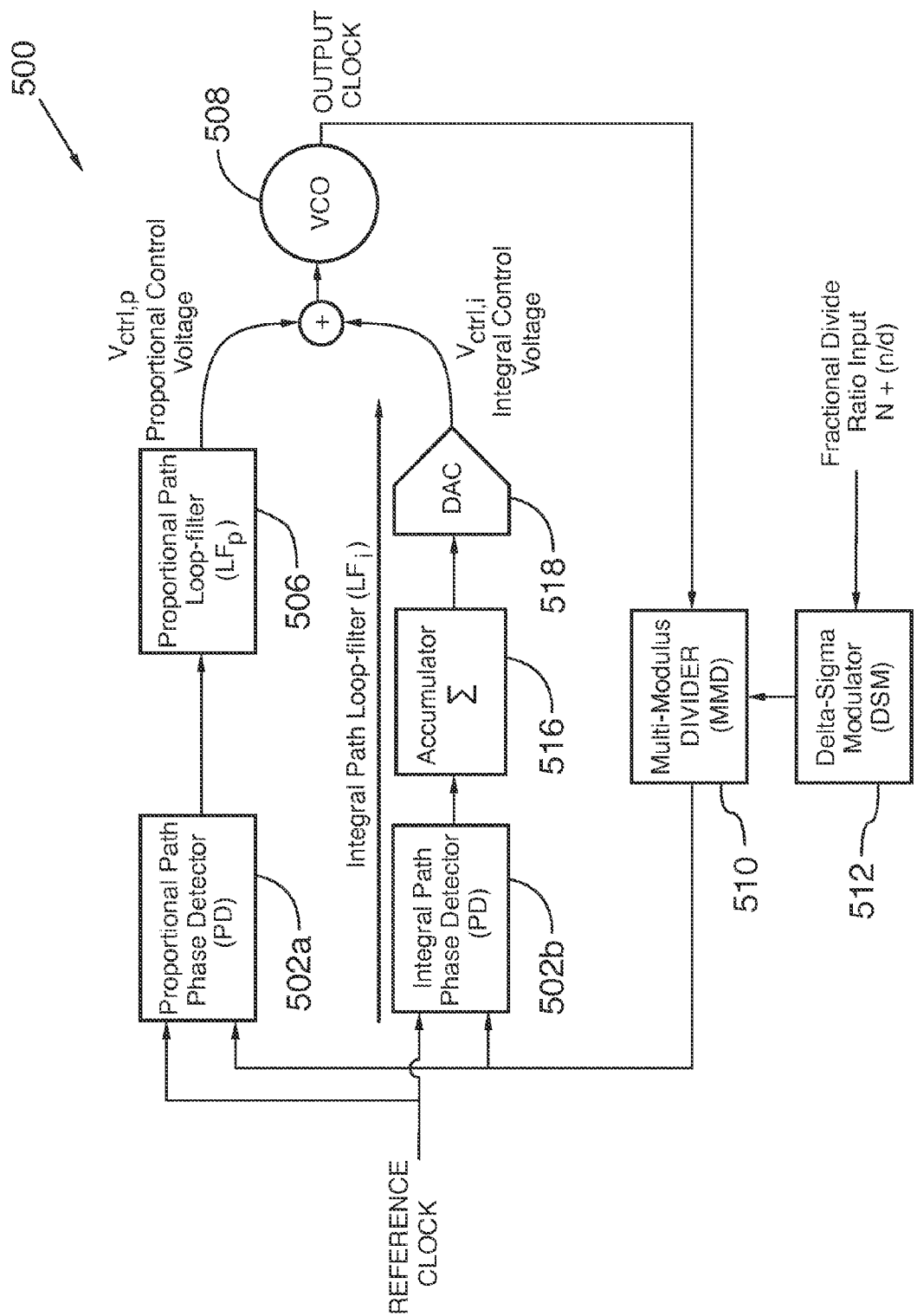
FIG. 5 is a block diagram of a dual path fractional-N PLL, according to an embodiment.

To fully take advantage of this architecture, the integral path, which is used for low-frequency tracking of the input reference clock, is commonly implemented in the digital domain. This modified architecture is referred to as a "hybrid" analog/digital dual-path PLL since the loop-filter is implemented using both analog filtering and digital signal processing circuitry. In this hybrid case, the integrator is replaced with a simple digital accumulator 516 running at the reference clock rate as shown in FIG. 5. A digital to analog converter (DAC) 518 may receive an output of accumulator 516. PLL 500 may further include a proportional path phase detector (PD) 502a and a proportional path loop-filter (LFp) 506, as well as a voltage-controlled oscillator (VCO) 508, a multi-modulus divider 510 and a delta-sigma modulator (DSM) 512.

In this structure, the phase-detector 502b also acts as an analog-to-digital convertor which converts the analog phase error at the input of the PLL 500 to a digital value that can be used by digital circuitry. The problem is that the process of quantizing the analog phase error is inherently very non-linear and as a result creates a large number of spurs inside the PLL bandwidth. As described previously, if the PLL is used with a close to integer multiplication ratio, these spurs will lie inside the PLL bandwidth and pass to the output unfiltered.

A common-way to convert the analog phase error to a digital signal is with a multi-bit, time-to-digital convertor (TDC). However, these circuits are generally very complex, power hungry, and suffer from random mismatch. In addition, the TDC resolution is commonly limited to a single inverter delay in the technology used.

Figure 6:
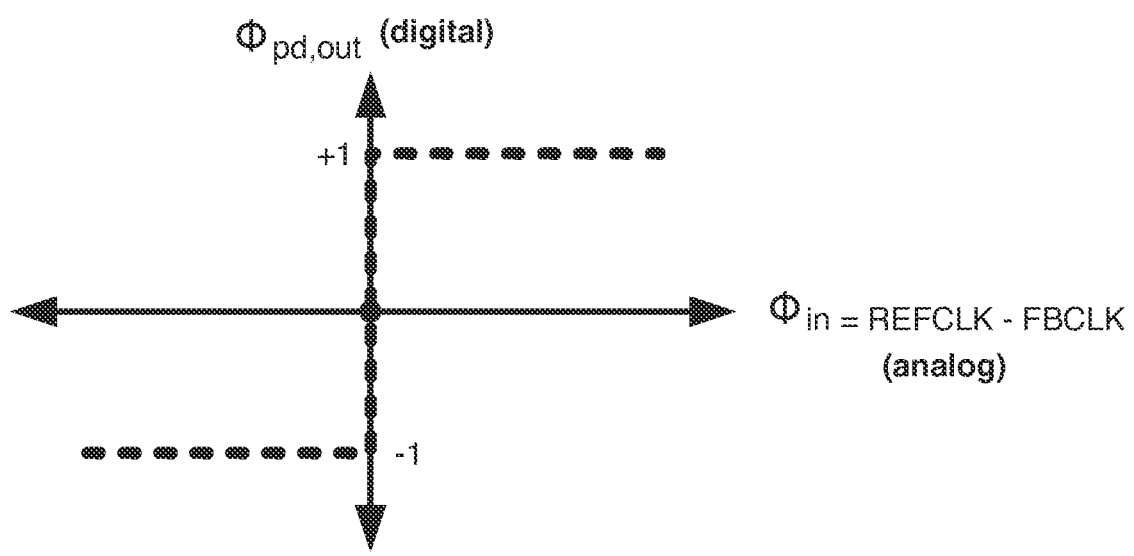
FIG. 6 is a graph illustrating the transfer function of a slicer.

A simpler, but also much more non-linear, way to convert the phase error to a digital value is to use a single two-level slicer. The transfer function of such a slicer is shown in FIG. 6.

Figure 7:
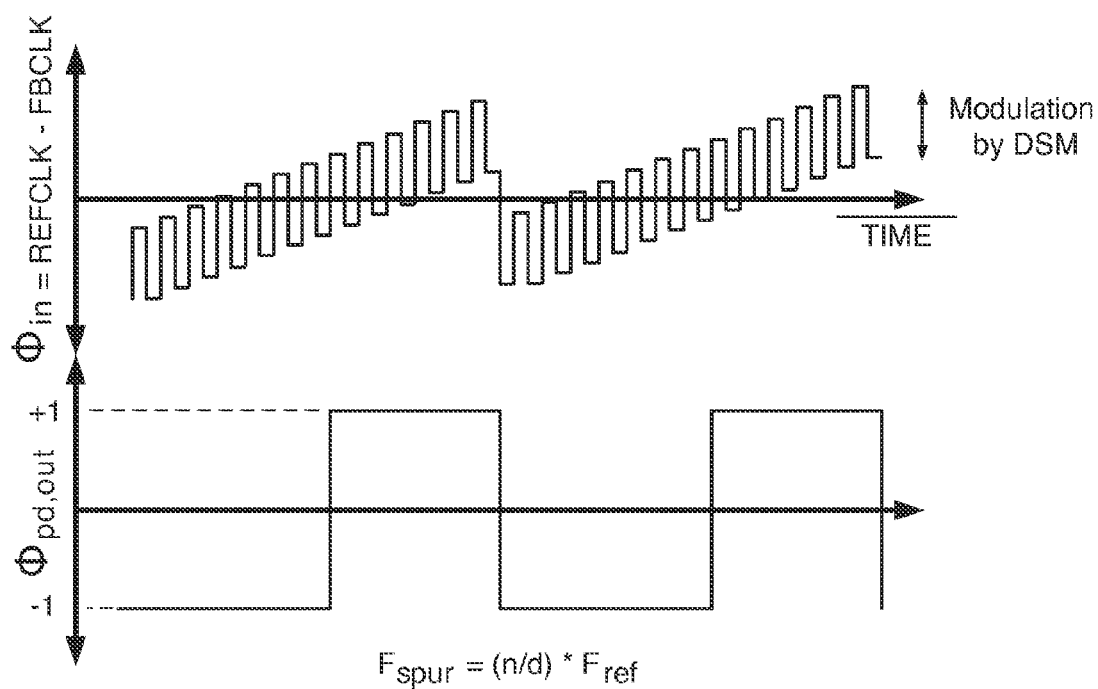
FIG. 7 is a graph illustrating slicer non-linearity creating a periodic tone in the integral path.

Advantages of such a slicer include that it is very low area, requires relatively little power, and has a low complexity. However, the non-linearity of the slicer results in fractional spurs of very large magnitude. The process of tone generation in the integral path of a fractional-N PLL is depicted in FIG. 7.

Here the DSM dithers the divide ratio in order to move quantization noise to higher frequencies where it is attenuated by the PLL loop. The fractional divide ratio, however, creates an underlying periodic sequence at the input of the phase detector which is then hard-limited by the slicer. This removes much of the benefits of the DSM modulation and a strong tone appears at the output at a fraction of the reference frequency.

Some of the embodiments described herein at least partially address the problem of spurs generated in the integral path of this dual path PLL by the non-linear quantization of a two-state phase-detector.

In light of the above description, a person of skill in the art will understand that dual-path, fractional-N PLL architectures that use a digital integral path generally suffer from large tones at fractions of the reference frequency. These tones are generated by the inherent non-linearity caused by phase-detector quantization. Although using a low-resolution phase-detector and DAC may be preferred, this approach creates very large spurs in the output spectrum due to the loss of information in the quantizing process. Moreover, the lower the resolution of the phase-detector, the larger the magnitude of these spurious tones become. In many applications, these tones can lie at frequencies in the bandwidth of the PLL where they appear at the output at unacceptable levels. Various embodiments described herein seek to compensate for the non-linear distortion of coarse integral path quantization by using a feed-forward digital-correction signal. This digital correction signal cancels the deterministic tones at the output of the quantizer and in turn, reduces the magnitude of fractional spurs generated by the PLL.

Figure 8:
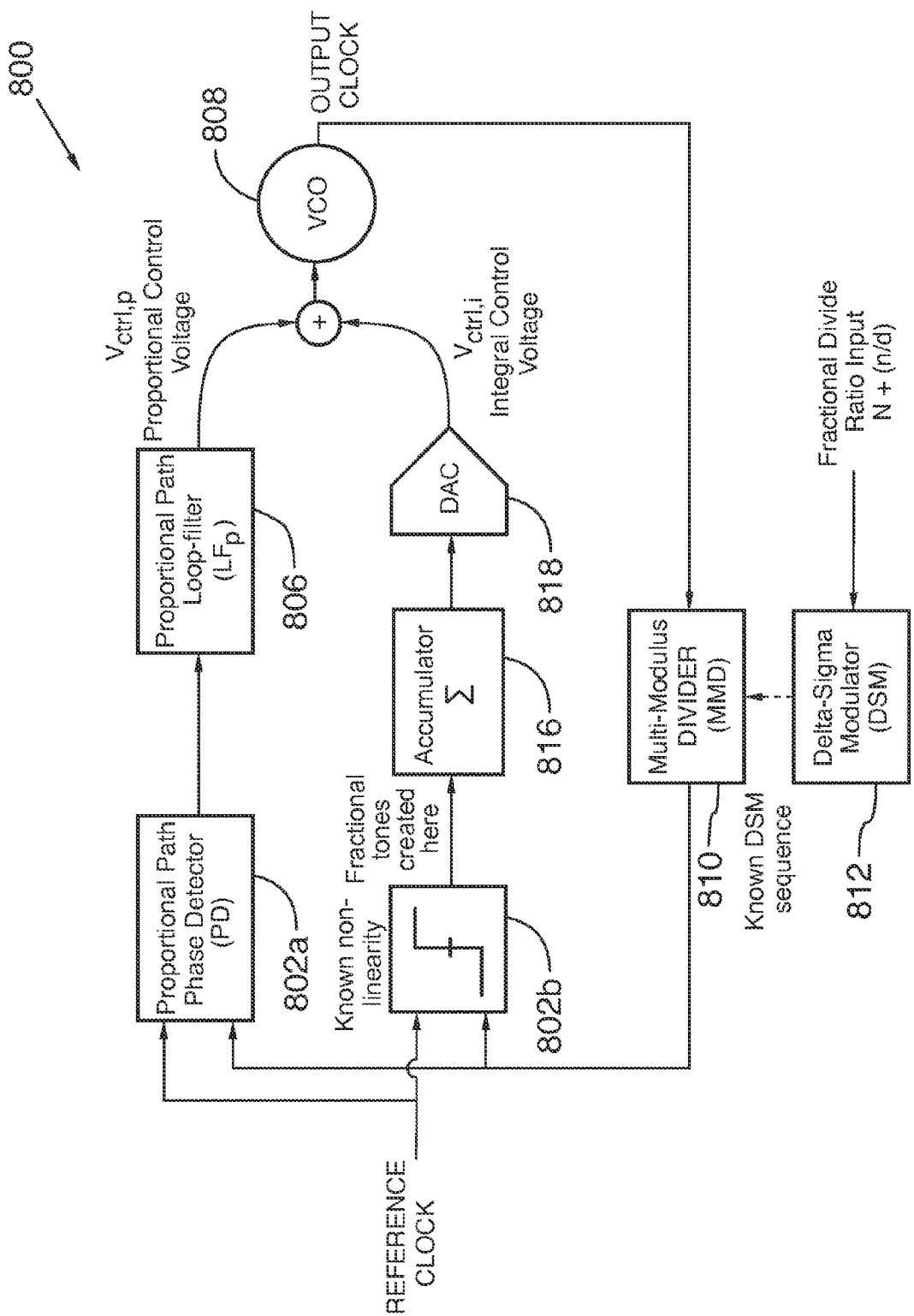
FIG. 8 is a block diagram of a dual path fractional-N PLL, according to an embodiment.

Reference is now made to FIG. 8, which illustrates a dual path PLL 800. PLL 800 may include an analog slicer 802b, a digital accumulator 816, and a digital to analog converter (DAC) 818. PLL 800 may further include a proportional path phase detector (PD) 802a and a proportional path loop-filter (LFp) 806, as well as a voltage-controlled oscillator (VCO) 808, a multi-modulus divider 810 and a delta-sigma modulator (DSM) 812. Fractional low-frequency tones created by integral path phase-detector quantization are generated from (1) a known DSM sequence, passing through a (2) known hard non-linearity (2-state phase detector e.g. phase detector 802b), with a (3) known analog gain. Consider the PLL components illustrated in FIG. 8 that combine to generate spurs from this non-linear quantization by a two-state phase detector.

Since the DSM sequence is deterministic, and the hard non-linearity from the analog slicer 802b can be perfectly replicated in the digital domain (a slicer merely returns the sign of the input analog signal), this information can be used to predict the tone generated by the quantization process. This information can then be used to digitally correct the non-linear output of the 2-state phase detector. This modified structure is illustrated in FIG. 9.

Figure 9:
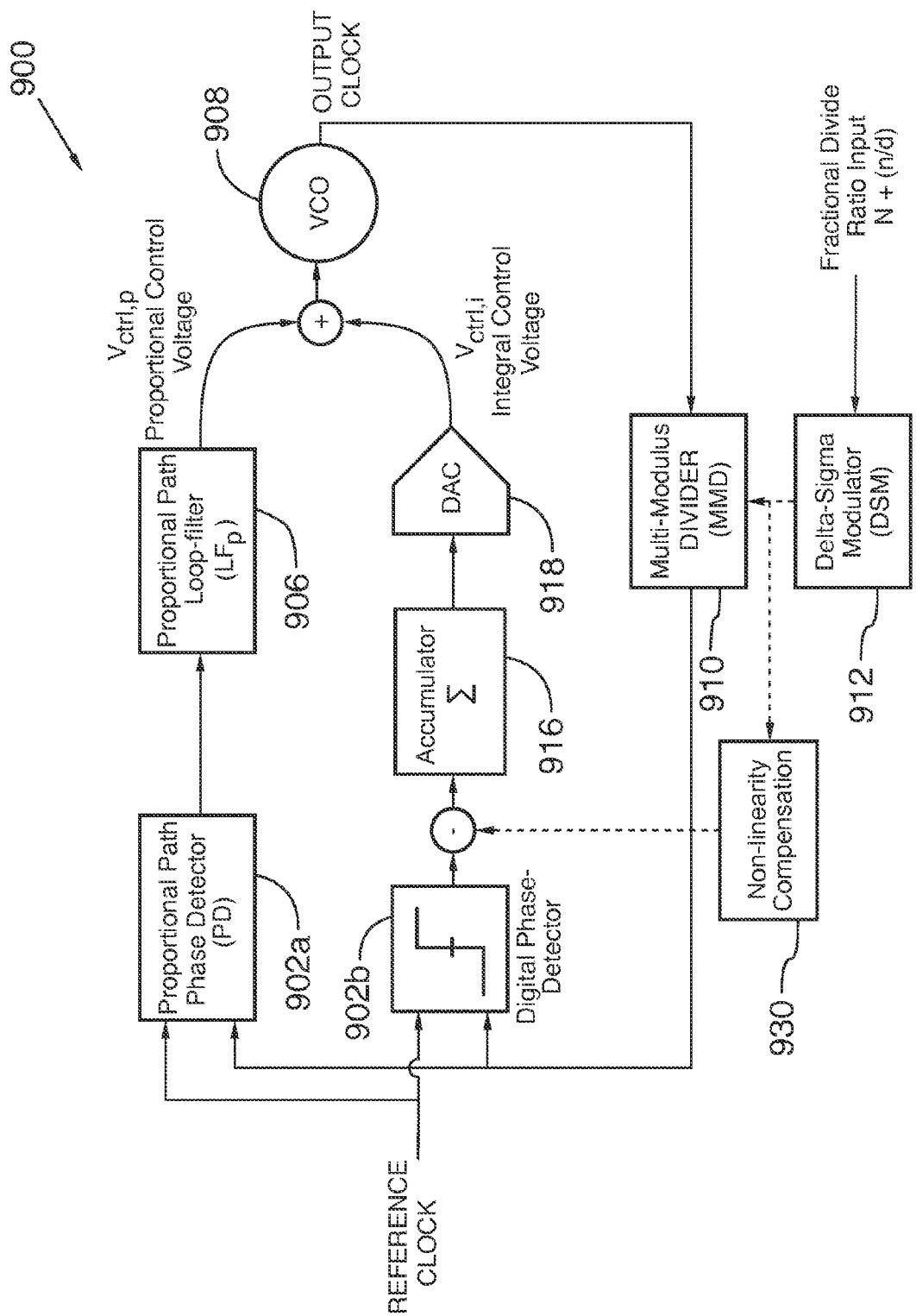
FIG. 9 is a block diagram of a dual path fractional-N PLL, according to an embodiment.

Reference is now made to FIG. 9, which illustrates a dual path PLL 900 that includes a Non-linearity Compensation component 930, according to an embodiment. It is important to note that the PLL architecture illustrated in FIG. 9 does not compensate or remove delta-sigma modulator noise at the output of the PLL 900. DSM noise will still be present at the output due to the parallel proportional path that also connects to the VCO 908. The goal of this correction is to reduce the strongly correlated tonal DSM noise at the output of the 1-bit integral path quantizer 902b, which in turn reduces the large fractional spurs at the PLL output (i.e. the output of VCO 908).

An important advantage of the embodiment illustrated in FIG. 9 is that it uses an analog slicer 902b, yet the gain and the behavior of this analog component is fully defined: a slicer only has two levels. It does not have a process dependent analog gain like a multi-level analog-to-digital convertor. As such, this embodiment does not require any calibration of the correction signal to any process dependent gain terms. PLL 900 may further include an analog slicer 902b, a digital accumulator 916, and a digital to analog converter (DAC) 918. PLL 900 may also include a proportional path phase detector (PD) 902a and a proportional path loop-filter (LFp) 906, as well as a voltage-controlled oscillator (VCO) 908, a multi-modulus divider 910 and a delta-sigma modulator (DSM) 912.

Figure 10:
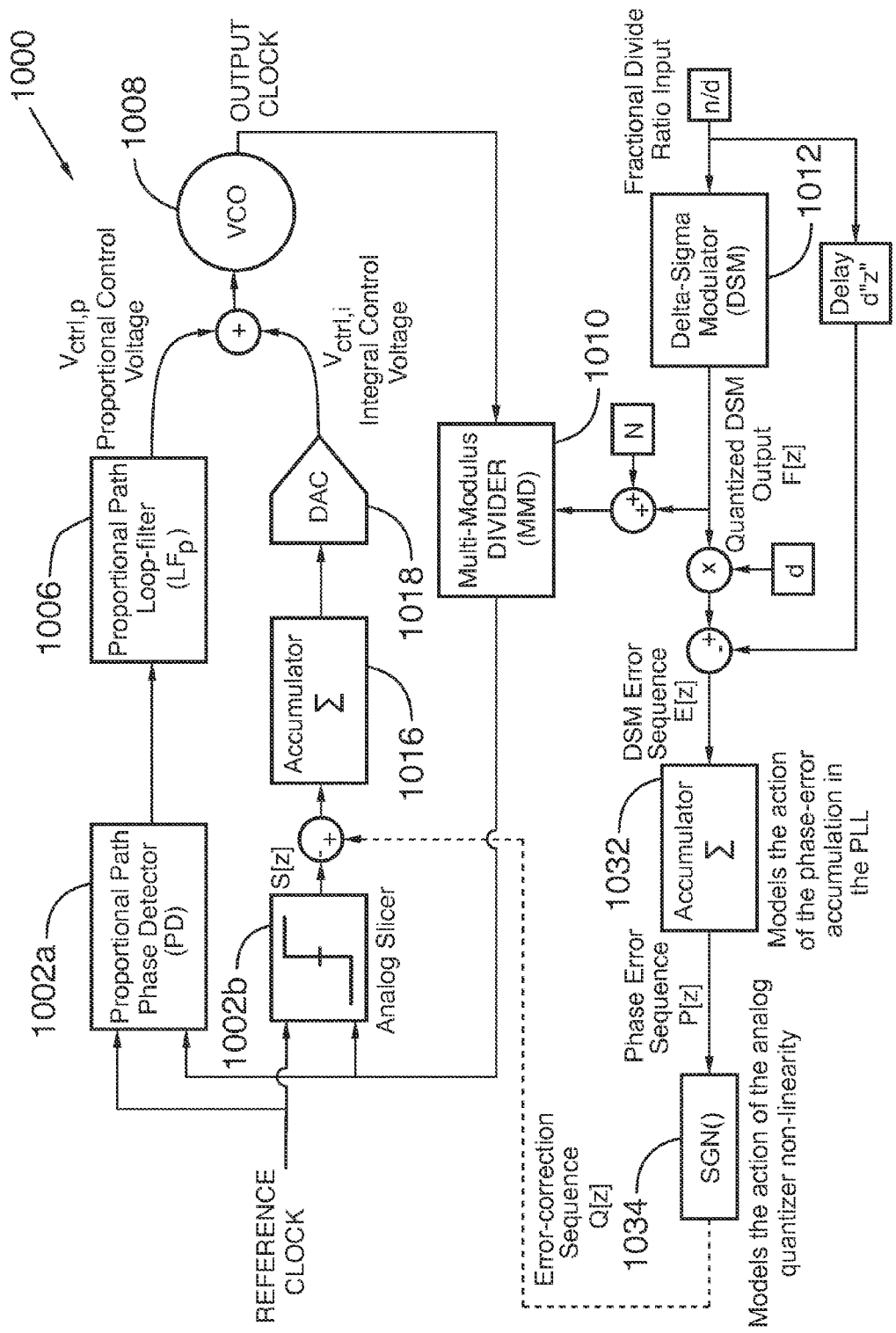
FIG. 10 is a block diagram of a dual path fractional-N PLL, according to an embodiment.

Reference is now made to FIG. 10, which illustrates a block diagram of such a PLL 1000 in accordance with an embodiment. Various embodiments disclosed herein, such as for example PLL 1000, eliminate non-linearly generated tones in dual-path, fractional-N phase locked loops that use a 1-bit quantizer (slicer) in the integral path. In some embodiments, this is accomplished by first generating a representative digital signal that predicts the distortion generated by the analog slicer. In various embodiments, this prediction of the analog slicer output to the deterministic DSM sequence is then used to eliminate the actual corrupted DSM noise sequence in the integral path. The end result is that the fractional tones generated by this path are completely eliminated.

PLL 1000 may comprise a proportional path phase detector (PD) 1002a and a proportional path loop-filter (LFp) 1006, as well as a voltage-controlled oscillator (VCO) 1008. In addition, PLL 1000 may include an analog slicer 1002b, a digital accumulator 1016, and a digital to analog converter (DAC) 1018. Furthermore, PLL 1000 may include a multi-modulus divider 1010, a delta-sigma modulator (DSM) 1012, an accumulator 1032, and an SGN component 1034.

Figure 11:
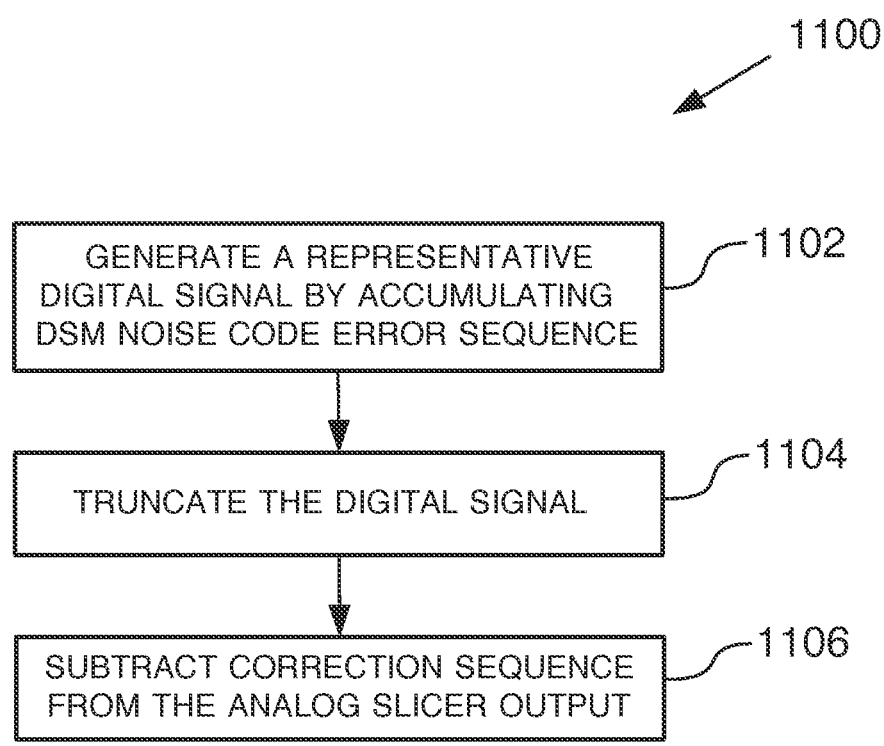
FIG. 11 is a flow chart illustrating a method of correcting a signal.

Reference is now made to FIG. 11, which illustrates a flow chart for a method 1100 for correcting a signal in a dual path PLL, according to an embodiment. Method 1100 may be executed by for example, PLL 1000 of FIG. 10. In an embodiment, the correction signal is generated as follows:

At 1102, accumulator 1032 generates a representative discrete digital sequence signal (P[z]) of the instantaneous phase-detector phase error by accumulating DSM noise code error sequence (E[z]).

At 1104, SGN component 1034 truncates P[z] to 1-bit, to replicate the analog phase-detector non-linearity (SGN(P[z])).

At 1106, the correction sequence (Q[z] generated at 1104) is subtracted from the analog slicer output (S[z]).

In an embodiment, a first step in this method involves generating a prediction of the instantaneous phase-error at the input of the PLL. The PLL feedback loop of PLL 1000 is designed such that the average phase of the feedback clock is continuously being corrected to track that of the reference. As described previously, the DSM (e.g. 1012 in FIG. 10) in the fractional-N PLL dithers the divide ratio such that the average output frequency can be a fractional multiple of the reference clock frequency. Note that the feedback divider (e.g. 1010 in FIG. 10) modulates the frequency of the feedback clock according to the instantaneous division ratio (N+F[z]), and thus the absolute phase (in radians) of the analog feedback clock is the summation (discrete time integral) of the division ratio sequence:

$$\theta_{feedback}(k) = \sum_{i=1}^{k} (N + F[i]) * T_{vco} * \frac{2\pi}{T_{ref}} \quad (5)$$

This equation stems from the fact that the absolute phase of a clock signal is the integral of its frequency. Here $T_{vco}$ is the average VCO period, $T_{ref}$ is the average reference clock period and k is the sample number of the DSM sequence.

The absolute phase of the reference clock (in radians) is:

$$\theta_{reference}(k) = k * 2\pi \quad (6)$$

The analog phase error at the input of the slicer is therefore:

$$\theta_{error}(k) = \theta_{reference}(k) - \theta_{feedback}(k) \quad (7)$$

$$\theta_{error}(k) = 2\pi * \frac{T_{vco}}{T_{ref}} * \left[ k * \frac{T_{ref}}{T_{vco}} - \sum_{i=1}^{k}(N + F[i]) \right] \quad (8)$$

$$\theta_{error}(k) = 2\pi * \frac{T_{vco}}{T_{ref}} * \sum_{i=1}^{k} \left( \frac{T_{ref}}{T_{vco}} - N - F[i] \right) \quad (9)$$

Note that the feedback loop will force the long-term average of this phase error to be zero, and thus:

$$\frac{T_{ref}}{T_{vco}} = N + \frac{\sum_{i=1}^{k} F[i]}{k} \quad (10)$$

The DSM is responsible for generating the random sequence F[z] such that the average is equal to the desired fractional division ratio:

$$\frac{\sum_{i=1}^{k} F[i]}{k} = \text{average}(F[i]) = \frac{n}{d} \quad (11)$$

The feedback loop forces the mean phase error to zero; however, there will still be instantaneous phase error deviations from this zero mean as defined by equation 9 at each sample instant k. It is these instantaneous phase deviations at the input to the non-linear slicer that generate tones. The digital sequence that appears at the output of the analog slicer (to guarantee negative feedback) is:

$$S[k] = -SGN[\theta_{error}(k)] \quad (12)$$

$$S[k] = SGN\left[ \sum_{i=1}^{k} \left( F[i] - \frac{n}{d} \right) \right] \quad (13)$$

Since S[k] is fully defined (there are no analog parameters that vary with process, temperature or voltage), an equal, but opposite correction signal can be generated to cancel this signal.

In the more general case, the input to the DSM (n/d) may not be a static signal, and could be time varying, and thus, this equation becomes:

$$S[k] = SGN\left[ \sum_{i=1}^{k} \left( F[i] - \frac{n[i]}{d[i]} \right) \right] \quad (14)$$

In some embodiments of this correction architecture, the DSM and following arithmetic functions may need to be pipelined, and thus, an appropriate delay (i) can be added to compensate:

$$S[k] = SGN\left[ \sum_{i=1}^{k} \left( F[i] - \frac{n[i-\tau]}{d[i-\tau]} \right) \right] \quad (15)$$

The final correction sequence that is used to compensate for the non-linear tones, and that is subtracted from the slicer output S(k) is therefore:

$$Q[k] = SGN\left[ \sum_{i=1}^{k} \left( F[i] - \frac{n[i-\tau]}{d[i-\tau]} \right) \right] \quad (16)$$

where Q[k] represents the feed forward signal, F[i] represents an output of the delta sigma modulator, n/d is a input to the DSM, and τ represents any possible pipelining delay that may exist. In some embodiments, τ may take on various values including, but not limited to, zero.

Figure 12A:
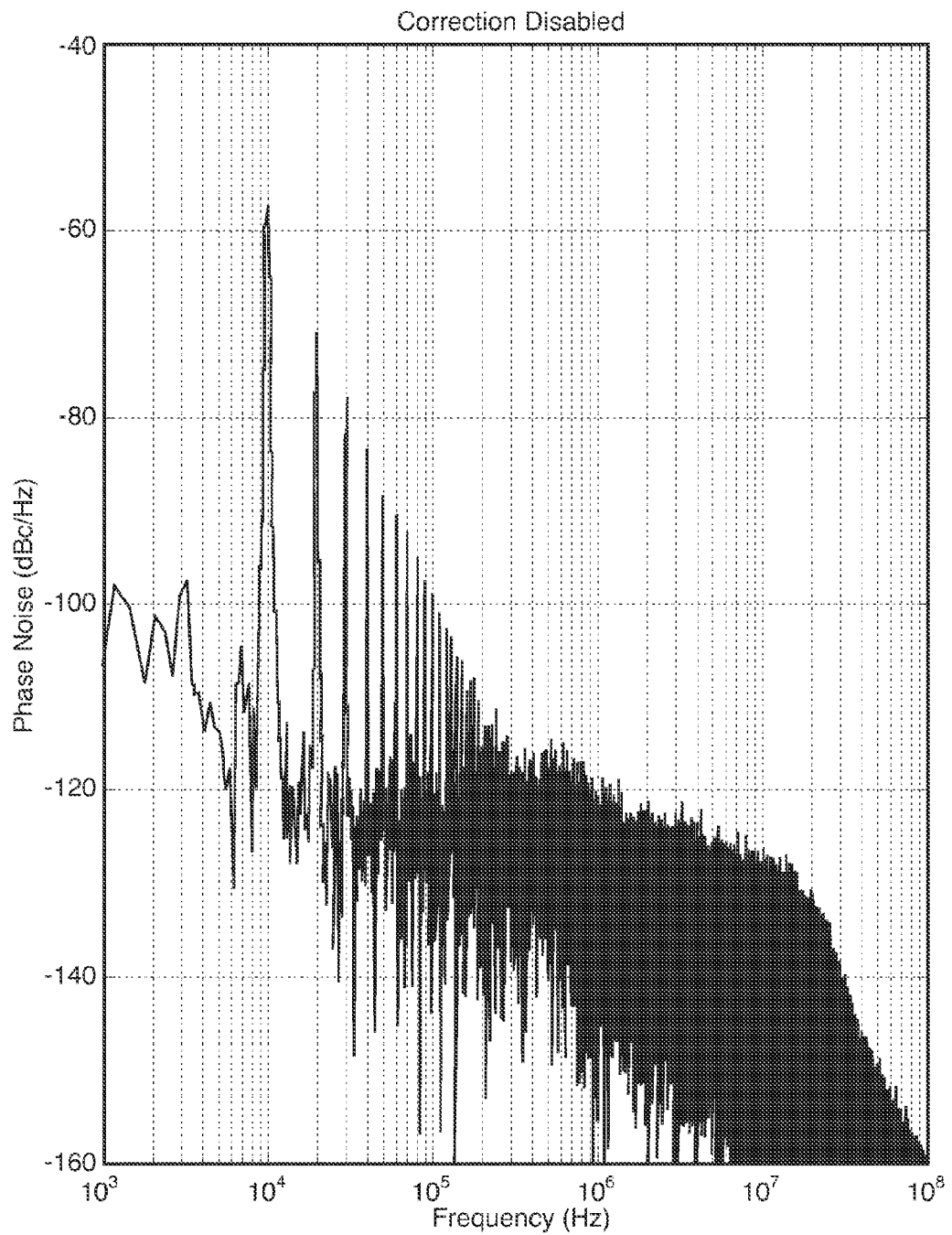
FIG. 12A is a graph illustrating PLL output phase noise.
Figure 12B:
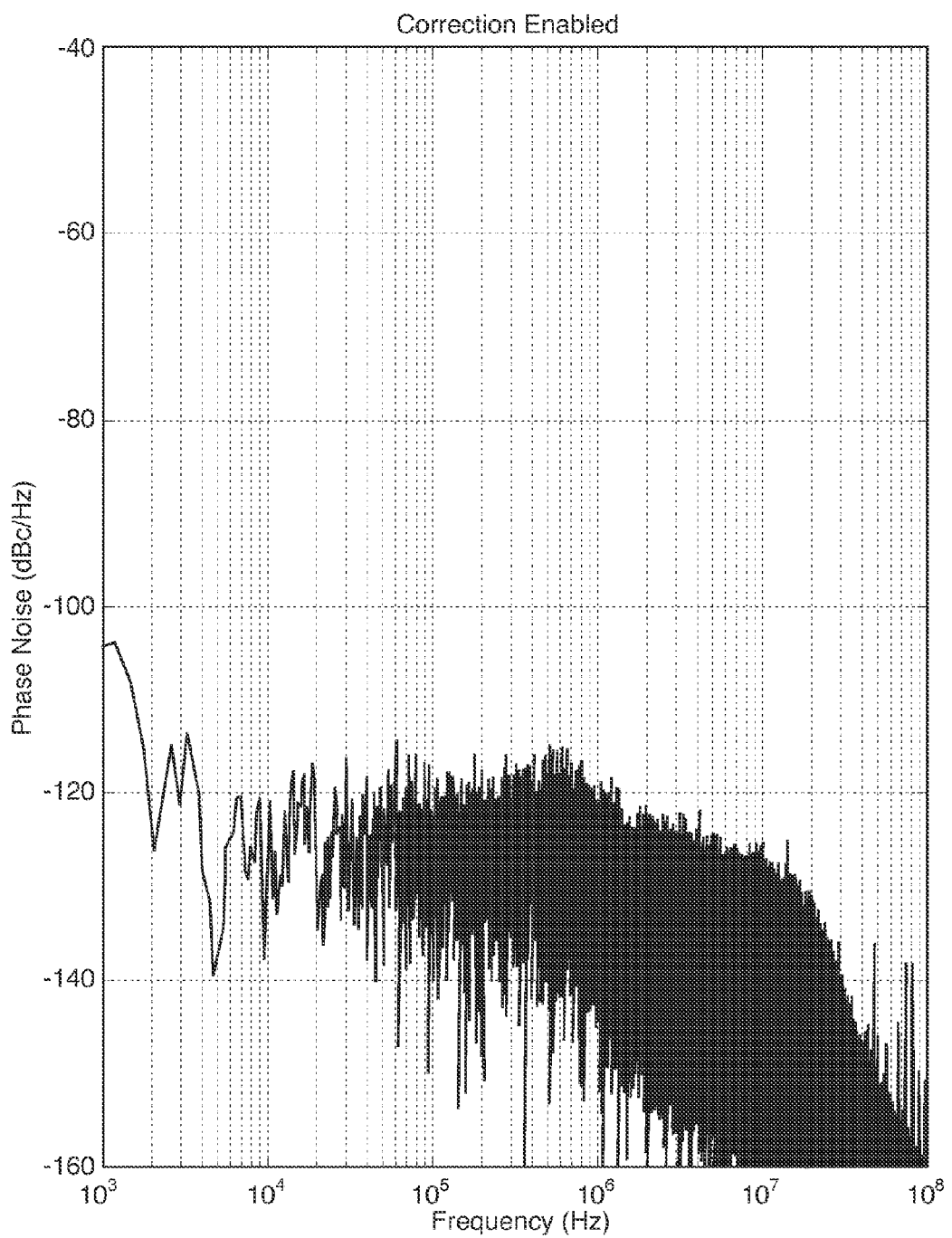
FIG. 12B is a graph illustrating output phase noise in a PLL, according to an embodiment of the present disclosure.

To illustrate the effectiveness of this approach, a behavioral model of the dual-path fractional-N PLL above was modeled with MATLAB. Reference is now made to FIGS. 12A and 12B, which illustrate graphs showing the residual DSM noise at the VCO output. In the case of both figures, the x-axis is the frequency in Hz and the y-axis is the phase noise in dBc/Hz.

FIG. 12A illustrates the DSM noise without the error correction approach of the present disclosure. FIG. 12B illustrates with DSM noise when embodiments of the present disclosure are utilized. In this example, the PLL is operating with a fractional offset such that the fractional tones are generated at 10 kHz (and harmonics), and will lie inside the PLL bandwidth.

Note that in both cases the filtered DSM noise is present at the output, but the tonal component of the noise due to the integral path non-linearity is eliminated in FIG. 12B. This approach does not remove the DSM noise from the VCO output, but it corrects for the non-linear tones generated in the integral path by the non-linear quantization of the slicer.

Figure 13:
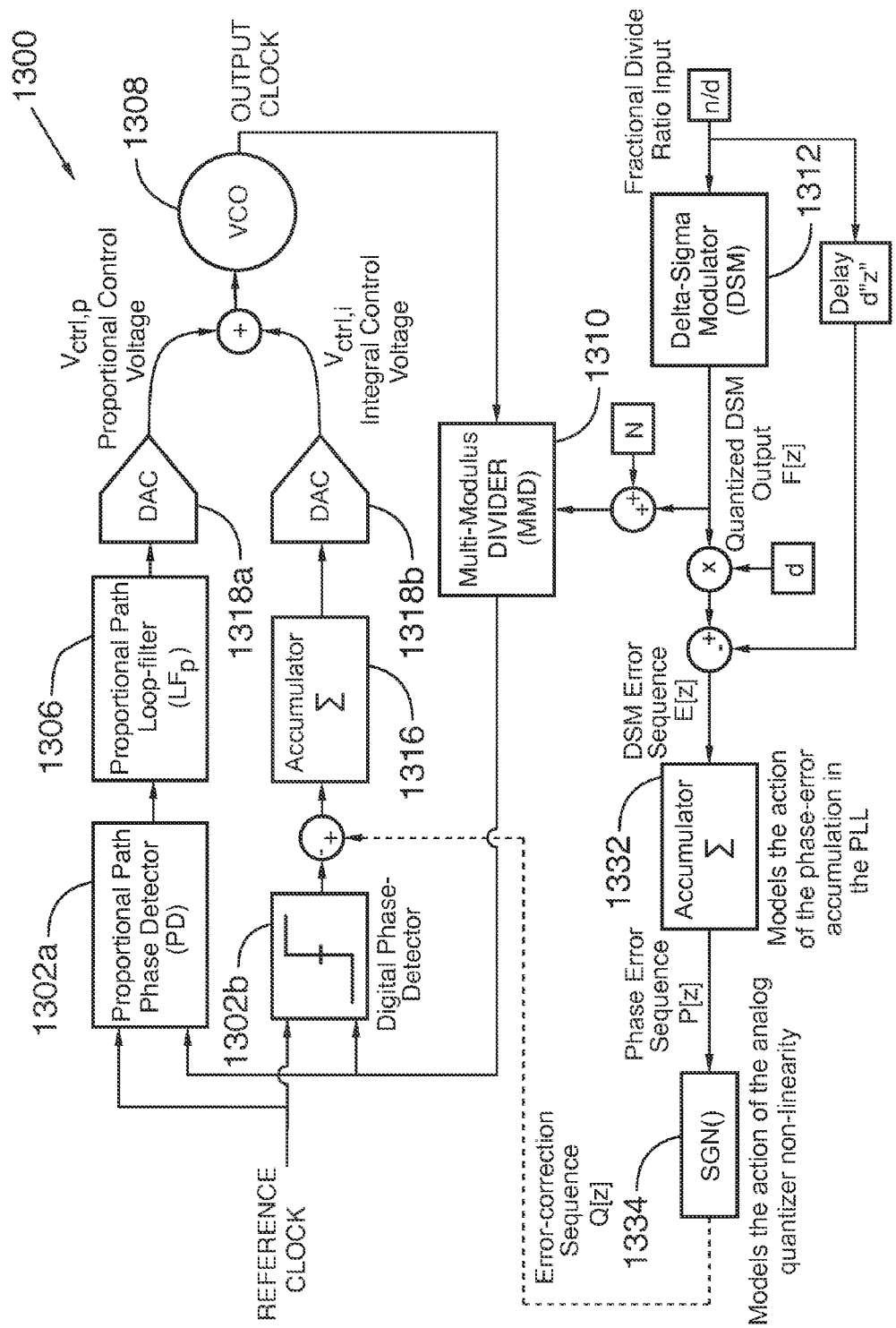
FIG. 13 is a block diagram of a dual path fractional-N PLL, according to an embodiment.

Reference is now made to FIG. 13, which illustrates a block diagram of a dual-path PLL in accordance with another embodiment of the present disclosure. The embodiment illustrated in FIG. 13, implements the separate proportional path using a fully digital loop filter 1306 and a DAC 1318a. This alternative embodiment does not change the effectiveness of the correction on the integral path. DSM noise may still pass through the proportional path to the output of the PLL.

PLL 1300 may also comprise a proportional path phase detector (PD) 1302a, and a voltage-controlled oscillator (VCO) 1308. In addition, PLL 1300 may include an analog slicer 1302b, a digital accumulator 1316, and a digital to analog converter (DAC) 1318b. Furthermore, PLL 1300 may include a multi-modulus divider 1310, a delta-sigma modulator (DSM) 1312, an accumulator 1332, and an SGN component 1334.

Figure 14:
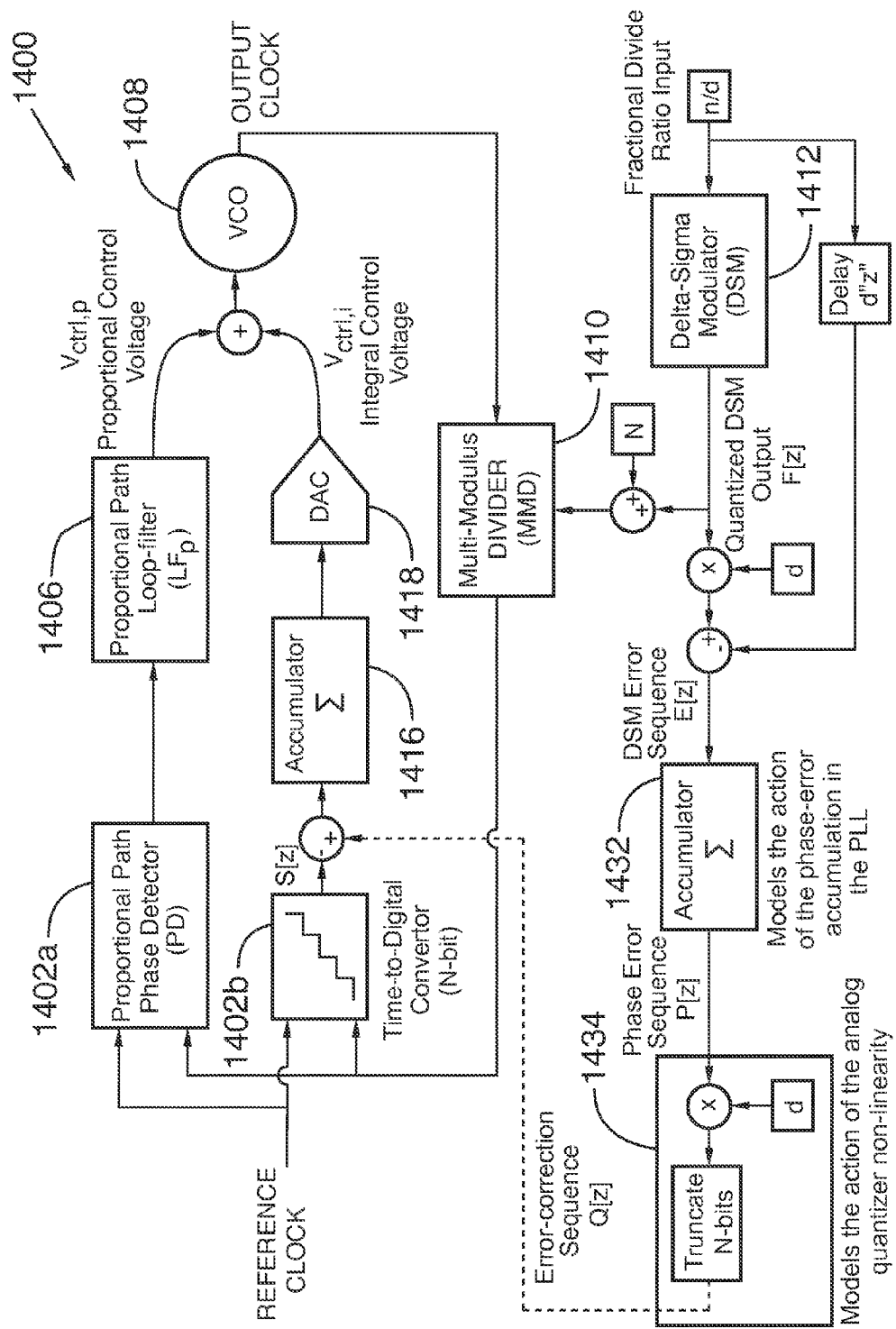
FIG. 14 is a block diagram of a dual path fractional-N PLL, according to an embodiment.

Reference is now made to FIG. 14, which illustrates a block diagram of a dual-path PLL 1400 in accordance with another embodiment of the present disclosure. The embodiment of FIG. 14, utilizes a multi-bit quantizer 1402b, such as for example but not limited to a TDC, in the integral path. Various embodiments such as these, given that they use a multi-bit quantizer, do not benefit from the power-savings associated with the use of a 1-bit quantizer. In addition, given that a multi-level analog quantizer has a gain that can vary with process, voltage and temperature, generally it is desirable to know these parameters in advance (e.g. by calibration or adaptation) to facilitate the non-linear tone cancellation.

An advantage of this embodiment is that the non-linear tones in S[z] are smaller to begin with. In the case where there is a large latency between signal E[z] and the correction signal Q[z], the cancellation will generally not be perfect due to the non-zero transport delay. This non-zero delay can result in reduced cancellation at higher frequencies and residual spurs in the output. Reducing the original magnitude of these spurs with a multi-bit quantizer as shown in PLL 1400 can result in lower residual high-frequency spurs, but at the cost of higher complexity and power.

Note that in PLL 1400 an N-bit correction signal is fed back to the integral path (instead of a single bit). Also, since the gain of the analog phase detector varies, an additional digital gain K is added in order to scale the feedback signal correctly.

PLL 1400 may also comprise a proportional path phase detector (PD) 1402a and a proportional path loop-filter (LFp) 1406, as well as a voltage-controlled oscillator (VCO) 1408. In addition, PLL 1400 may include multi-bit quantizer 1402b, a digital accumulator 1416, and a digital to analog converter (DAC) 1418. Furthermore, PLL 1400 may include a multi-modulus divider 1410, a delta-sigma modulator (DSM) 1412, an accumulator 1432, and module 1434.

Figure 15:
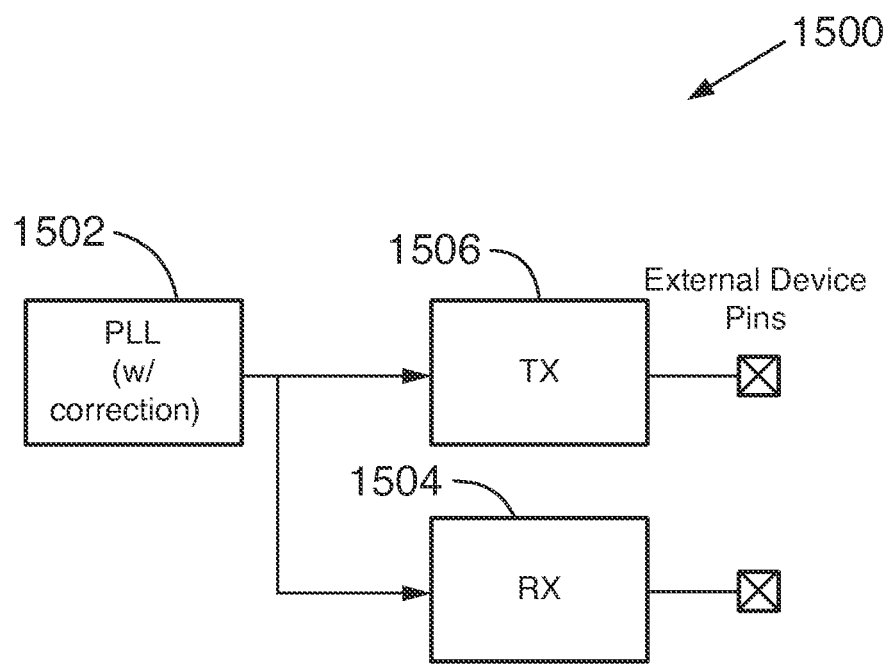
FIG. 15 is a block diagram of a dual path fractional-N PLL utilized in a SERDES, according to an embodiment.

Reference is now made to FIG. 15, which is a block diagram of a PLL 1502 utilized in clock generation of a SERDES (serializer-deserializer) 1500. More particularly, the embodiment illustrated in FIG. 15, can be thought of as a more specific implementation of the embodiment of FIG. 10, as implemented in a serial data PHY. In FIG. 15, the PLL 1502 is used to generate the low jitter clock that drives both the RX 1504 and TX 1506 of a SERDES (serializer-deserializer) 1500. Specifically, this embodiment can be used in a serial data link that requires fractional-N clock generation and low integrated jitter inside the PLL bandwidth where fractional spurious tones will exist.

Embodiments disclosed herein allow the use of a simple, but highly non-linear 2-state phase detector in the integral path, when implementing a dual-path hybrid digital PLL. Without the correction techniques disclosed herein, the phase-detector may require the design of a high-resolution time-to-digital converter (TDC) to meet the strict low-frequency jitter requirements in serial data PHY applications. TDCs tend to be very complex and consume a significant amount of power compared to a single slicer. Using the correction techniques disclosed herein, can also allow for more freedom in setting the parameters of the PLL dynamics, given that the integral path gain does not need to be set extremely low to attenuate these spurious tones.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications, and variations may be effected to the particular embodiments by those of skill in the art without departing from the scope, which is defined solely by the claims appended hereto.

What is claimed is:

1. A dual-path, hybrid analog-digital delta-sigma modulator (DSM) based fractional-N phase-lock-loop (PLL) comprising:

an integral path for providing an integral path control signal, the integral path implemented in the digital domain, the integral path including an integral path phase detector;

a proportional path for providing a proportional path control signal, wherein the proportional path control signal and the integral path control signal are combined to produce a combined control signal; and a feed-forward error correction signal generator for attenuating in-band spurs generated by quantization of a phase detector error output from the integral path phase detector, the feed-forward error correction signal generator configured to:

generate a representative signal of the instantaneous phase detector error output from the integral path phase detector by accumulating a DSM noise code sequence;

truncate the representative signal to replicate non-linearity of the integral path phase detector; and subtract the truncated representative signal from an output of the integral path phase detector.

2. The dual-path, hybrid analog-digital DSM based fractional-N PLL of claim 1, wherein the proportional path is implemented in the analog domain.

3. The dual-path, hybrid analog-digital DSM based fractional-N PLL of claim 1, wherein the proportional path is implemented in the digital domain.

4. The dual-path, hybrid analog-digital DSM based fractional-N PLL of claim 1, wherein the integral path phase detector comprises a 1-bit phase quantizer.

5. The dual-path, hybrid analog-digital DSM based fractional-N PLL of claim 1, wherein the integral path phase detector comprises a multi-bit phase quantizer.

6. The dual-path, hybrid analog-digital DSM based fractional-N PLL of claim 1, wherein the integral path phase detector comprises an analog phase detector.

7. The dual-path, hybrid analog-digital DSM based fractional-N PLL of claim 1, wherein the phase detector converts an input analog phase error to a digital value.

8. The dual-path, hybrid analog-digital DSM based fractional-N PLL of claim 1, wherein the proportional path comprises:

a proportional path phase detector; and a proportional path loop filter coupled to an output of the proportional path phase detector;

and further wherein the integral path further comprises:

an integral path loop filter coupled to an output of the integral path phase detector; and further wherein the hybrid analog-digital DSM based fractional-N PLL further comprises a voltage controlled oscillator (VCO) for receiving the combined control signal.

9. The dual-path, hybrid analog-digital DSM based fractional-N PLL of claim 1, wherein the feed-forward error correction signal generator is configured to include gain in the representative signal to account for gain variations in the phase detector due to at least one of temperature, process, and voltage.

10. A serializer-deserializer comprising the dual-path, hybrid analog-digital DSM based fractional-N PLL of claim 1.

11. A method of correcting spurious tones in a dual-path, hybrid analog-digital delta-sigma modulator (DSM) based fractional-N phase-lock-loop (PLL), the PLL including an integral path implemented in the digital domain, a proportional path, and a DSM, the integral path including an integral path phase detector, the method comprising:

generating a representative signal of the instantaneous phase detector error output from the integral path phase detector by accumulating a DSM noise code sequence;

truncating the representative signal to replicate non-linearity of the integral path phase detector; and subtracting the truncated representative signal from an output of the phase detector.

12. A dual-path, hybrid analog-digital delta-sigma modulator (DSM) based fractional-N phase-lock-loop (PLL) comprising:

an integral path for providing an integral path control signal, the integral path implemented in the digital domain, the integral path including an integral path phase detector;

a proportional path for providing a proportional path control signal, wherein the proportional path control signal and the integral path control signal are combined to produce a combined control signal;

a feed-forward error correction signal generator for generating a feed-forward signal for attenuating in-band spurs generated by quantization of a phase detector error output from the integral path phase detector;

a delta sigma modulator (DSM) coupled to the feed-forward error correction signal generator; and a fractional divider in a feedback path of the fractional-N PLL, the fractional divider having an input for receiving a control signal from the delta sigma modulator, wherein the feed-forward error correction signal generator generates the feed forward correction signal according to the equation:

$$Q[k] = SGN\left[\sum_{i=1}^{k}\left(F[i] - \frac{n[i-\tau]}{d[i-\tau]}\right)\right]$$

where Q[k] represents the feed forward signal, F[i] represents an output of the delta sigma modulator, n/d is a input to the DSM, and τ represents a possible pipelining delay.

13. The dual-path, hybrid analog-digital DSM based fractional-N PLL of claim 12, wherein the proportional path is implemented in the analog domain.

14. The dual-path, hybrid analog-digital DSM based fractional-N PLL of claim 12, wherein the proportional path is implemented in the digital domain.

15. The dual-path, hybrid analog-digital DSM based fractional-N PLL of claim 12, wherein the integral path phase detector comprises a 1-bit phase quantizer.

16. The dual-path, hybrid analog-digital DSM based fractional-N PLL of claim 12, wherein the integral path phase detector comprises a multi-bit phase quantizer.

17. The dual-path, hybrid analog-digital DSM based fractional-N PLL of claim 12, wherein the integral path phase detector comprises an analog phase detector.

18. The dual-path, hybrid analog-digital DSM based fractional-N PLL of claim 12, wherein the phase detector converts an input analog phase error to a digital value.

19. The dual-path, hybrid analog-digital DSM based fractional-N PLL of claim 12, wherein the proportional path comprises:

a proportional path phase detector; and a proportional path loop filter coupled to an output of the proportional path phase detector;

and further wherein the integral path further comprises:

an integral path loop filter coupled to an output of the integral path phase detector; and further wherein the hybrid analog-digital DSM based fractional-N PLL further comprises a voltage controlled oscillator (VCO) for receiving the combined control signal.

20. The dual-path, hybrid analog-digital DSM based fractional-N PLL of claim 12, wherein the feed-forward error correction signal includes gain to account for gain variations in the phase detector due to at least one of temperature, process, and voltage.

21. A serializer-deserializer comprising the dual-path, hybrid analog-digital DSM based fractional-N PLL of claim 12.

* * * * *